(12) United States Patent
Satoh et al.

(10) Patent No.: US 10,224,500 B2
(45) Date of Patent: Mar. 5, 2019

(54) ORGANIC ELECTRONIC DEVICE AND METHOD OF MANUFACTURING THE SAME

(71) Applicant: Samsung Electronics Co., Ltd., Suwon-si, Gyeonggi-do (KR)

(72) Inventors: Ryuichi Satoh, Numazu-si (JP); Kyusik Kim, Yongsin-si (KR); Kyung Bae Park, Hwaseong-si (KR); Yong Wan Jin, Seoul (KR); Chuljoon Heo, Busan (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 164 days.

(21) Appl. No.: 14/974,096

(22) Filed: Dec. 18, 2015

(65) Prior Publication Data

US 2016/0380222 A1 Dec. 29, 2016

(30) Foreign Application Priority Data

Jun. 24, 2015 (KR) .................. 10-2015-0089543

(51) Int. Cl.

| H01L 21/00 | (2006.01) |
|---|---|
| H01L 51/44 | (2006.01) |
| H01L 27/30 | (2006.01) |
| H01L 51/52 | (2006.01) |
| H01L 51/00 | (2006.01) |

(52) U.S. Cl.
CPC .......... *H01L 51/448* (2013.01); *H01L 27/307* (2013.01); *H01L 51/5253* (2013.01); *H01L 51/006* (2013.01); *H01L 51/0046* (2013.01); *H01L 51/0058* (2013.01); *H01L 51/0061* (2013.01); *H01L 51/0062* (2013.01); *H01L 2251/303* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| 6,759,146 B2 | 7/2004 | Aziz et al. |
|---|---|---|
| 7,659,499 B2 | 2/2010 | Maehara |
| 8,828,760 B2 | 9/2014 | Lee et al. |
| 2003/0129298 A1* | 7/2003 | Tera ................. H01L 51/5253 427/66 |
| 2007/0012955 A1 | 1/2007 | Ihama |
| 2012/0100285 A1 | 4/2012 | Uetani |
| 2012/0298846 A1 | 11/2012 | Nomura et al. |
| 2015/0002719 A1 | 1/2015 | Isono et al. |

FOREIGN PATENT DOCUMENTS

| EP | 1311009 A2 | 5/2003 |
|---|---|---|
| JP | 4116398 B2 | 7/2008 |
| KR | 20140017108 A | 2/2014 |
| WO | WO-10147040 A1 | 12/2010 |
| WO | WO-11099606 A1 | 8/2011 |

* cited by examiner

*Primary Examiner* — Hung Vu
(74) *Attorney, Agent, or Firm* — Harness, Dickey & Pierce, P.L.C.

(57) ABSTRACT

An organic electronic device includes an organic device including an organic material, a first protective film on the organic device, a second protective film on the first protective film and including a same material as the first protective film, and a third protective film on the second protective film.

7 Claims, 7 Drawing Sheets

ORGANIC ELECTRONIC DEVICE AND METHOD OF MANUFACTURING THE SAME

CROSS-REFERENCE TO RELATED APPLICATION

This application claims priority to and the benefit of Korean Patent Application No. 10-2015-0089543 filed in the Korean Intellectual Property Office on Jun. 24, 2015, the entire contents of which are incorporated herein by reference.

BACKGROUND

1. Field

Example embodiments provide an organic electronic device and a method of manufacturing the same.

2. Description of the Related Art

An organic electronic device including an organic material (e.g., an organic light emitting device or an organic photoelectric device) includes an encapsulation substrate for preventing or inhibiting degradation of the organic material. The encapsulation substrate may be made of glass, etc. However, the encapsulation substrate made of glass may be damaged by an external impact, resulting in a thicker electronic device.

Recently, research on depositing a thin film instead of the encapsulation substrate made of glass has been undertaken. However, the thin film requires a relatively high temperature process, but the organic material for an organic electronic device may be more easily degraded by heat at the relatively high temperature. Accordingly, the thin film may be formed at a relatively low temperature at which the organic material is not degraded, but a process margin for forming the thin film may become smaller, and sealing performance for blocking moisture and air may become weaker.

SUMMARY

Example embodiments provide an organic electronic device capable of preventing or inhibiting thermal degradation of an organic material, and simultaneously improving sealing performance.

Example embodiments also provide an electronic device including the organic electronic device.

Example embodiments also provide a method of manufacturing the organic electronic device.

According to example embodiments, an organic electronic device includes an organic device including an organic material, a first protective film on the organic device, a second protective film on the first protective film and including a same material as the first protective film, and a third protective film on the second protective film.

The first protective film and the second protective film may include one of an oxide, nitride, and oxynitride.

The one of the oxide, nitride, and oxynitride includes at least one of aluminum, titanium, zirconium, hafnium, tantalum, and silicon.

The first and second protective films may have different film properties that are examined by a transmission electron microscope (TEM).

The second protective film may have a higher film density than the first protective film.

The second protective film may be formed at a higher temperature than the first protective film.

The first protective film may be formed at a temperature of less than or equal to about 110° C., while the second protective film may be formed at a temperature of less than or equal to about 220° C.

The second protective film may be thicker than the first protective film.

The first protective film may have a thickness of about 1 nm to about 50 nm.

The third protective film may include one of an oxide, nitride, oxynitride, an organic material, and an organic/inorganic composite.

The organic device may include a first electrode and a second electrode facing each other, and an organic layer between the first electrode and the second electrode and including the organic material.

The organic material may include at least one of a conductive compound, an insulating compound, a semiconductor compound, a light-absorbing compound, and a light emitting compound.

According to example embodiments, an electronic device includes the organic electronic device.

According to example embodiments, a method of manufacturing an organic electronic device includes manufacturing an organic device including an organic material, forming a first protective film on the organic device at a first temperature and including a first material, forming a second protective film on the first protective film at a second temperature higher than the first temperature and including the first material, and forming a third protective film on the second protective film.

The first temperature may be less than or equal to about 110° C.

The second temperature may be less than or equal to about 220° C.

The first protective film may be formed in an atomic deposition method.

Manufacturing the organic device may include forming a first electrode, forming at least one organic layer on the first electrode, and forming a second electrode on the organic layer.

DETAILED DESCRIPTION

Figure 1:
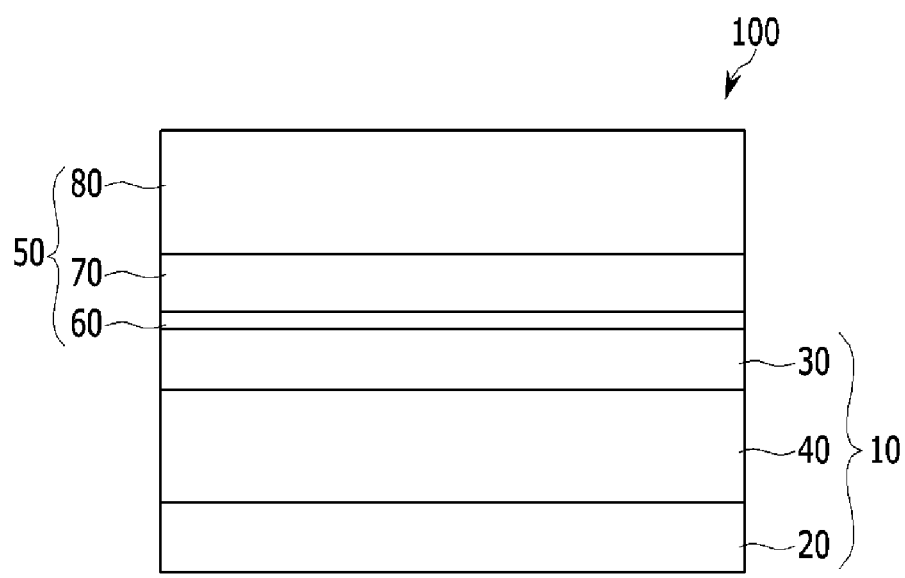
FIG. 1 is a schematic cross-sectional view showing an organic electronic device according to example embodiments.

Example embodiments will hereinafter be described in detail, and may be more easily performed by those who have common knowledge in the related art. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, an organic electronic device according to example embodiments is described.

FIG. 1 is a schematic cross-sectional view of an organic electronic device according to example embodiments.

Referring to FIG. 1, an organic electronic device 100 according to example embodiments includes an organic device 10 and an encapsulation structure 50 positioned on the organic device 10.

The organic device 10 includes a first electrode 20 and a second electrode 30, and an organic layer 40 between the first electrode 20 and the second electrode 30.

One of the first electrode 10 and the second electrode 20 is an anode and the other is a cathode. At least one of the first electrode 10 and the second electrode 20 may be a light-transmitting electrode, and the light-transmitting electrode may be made of, for example, a transparent conductor (e.g., indium tin oxide ITO or indium zinc oxide IZO), or a metal thin layer of a thin monolayer or multilayer. When one of the first electrode 10 and the second electrode 20 is a non-light-transmitting electrode, the non-light-transmitting electrode may be made of, for example, an opaque conductor (e.g., aluminum (Al)).

The organic layer 40 may be a single layer or a stacked structure having two or more layers and may include at least one organic material. The organic material may be, for example, a monomer, an oligomer, and/or a polymer, and may include, for example, at least one of a conductive compound, an insulating compound, a semiconductor compound, a light-absorbing compound, and a light emitting compound.

For example, the organic layer 40 includes a p-type semiconductor and an n-type semiconductor to form a pn junction, and absorbs external light to generate excitons and then separates the generated excitons into holes and electrons. Herein, at least one of the p-type semiconductor and the n-type semiconductor may include the organic material.

For example, the organic layer 40 may include a light-absorbing compound and may absorb a part or all of a visible ray wavelength region.

For example, the organic layer 40 may include a light emitting compound, and may emit light in a part of a visible ray wavelength region.

The organic layer 40 may include, for example polyaniline; polypyrrole; polythiophene; poly(p-phenylenevinylene); benzodithiophene; thienothiophene; pentacene; perylene; poly(3,4-ethylenedioxythiophene) (PEDOT); poly (3-alkylthiophene); polytriphenylamine; phthalocyanine; sub-phthalocyanine; tin (II) phthalocyanine (SnPc); copper phthalocyanine; triarylamine; benzidine; pyrazoline; styrylamine; hydrazone; carbazole; thiophene; selenophene; quinacridone; fullerene; a derivative thereof; or a combination thereof, but is not limited thereto.

An auxiliary layer (not shown) may be further present between the first electrode 20 and the organic layer 40 and/or between the second electrode 30 and the organic layer 40. The auxiliary layer improves charge injection and/or charge transfer between the first electrode 20 and the organic layer 40 and/or the second electrode 30 and the organic layer 40, and may be, for example, an electron transport layer, an electron injection layer, an electron extraction layer, an electron blocking layer, a hole transport layer, a hole injection layer, a hole extraction layer, and/or a hole blocking layer, but is not limited thereto. The auxiliary layer may include, for example, an organic material, an inorganic material, or an organic/inorganic material. The organic material may be an organic compound having hole or electron characteristics, and the inorganic material may be, for example, metal oxides (e.g., molybdenum oxide, tungsten oxide, and nickel oxide).

The encapsulation structure 50 includes a first protective film 60 positioned on the organic device 10, a second protective film 70 positioned on the first protective film 60, and a third protective film 80 positioned on the second protective film 70.

The first protective film 60 and the second protective film 70 may be formed of the same material under different process conditions.

The first protective film 60 and the second protective film 70 may include, for example, an oxide, nitride, or oxynitride, for example, an oxide, nitride, or oxynitride including at least one of aluminum (Al), titanium (Ti), zirconium (Zr), hafnium (Hf), tantalum (Ta), and silicon (Si).

The first protective film 60 and the second protective film 70 may be deposited at different process temperatures.

The first protective film 60 may be deposited at a temperature where an organic material included in the organic layer 40 of the organic device 10 is not degraded, for example, at a lower temperature than a transition temperature ($T_g$) or a thermal deposition temperature ($T_d$) of the organic material.

The first protective film 60 may be, for example, deposited at less than or equal to about 110° C., and for example, at a temperature ranging from about 50 to about 110° C. The first protective film 60 may be, for example, formed in an atomic layer deposition method within the temperature range.

Because the second protective film 70 is formed on the first protective film 60, a process temperature may be adjusted regardless of degradation of the organic material included in the organic layer 40 of the organic device 10. Accordingly, a process margin for the second protective film 70 may be increased, and a protective film having relatively high film qualities or properties may be formed without restriction of the process temperature.

The second protective film 70 may be deposited at a higher temperature than the first protective film 60, for example, at less than or equal to about 220° C. The second protective film 70 may be deposited at a temperature ranging from about 80 to about 220° C., and for example, about 100 to about 200° C. In this way, the second protective film 70 is deposited at a relatively high temperature and formed as a thin film having a desired condition and thus may effectively block inflow of moisture and oxygen from the external environment.

In this way, the first protective film 60 and the second protective film 70 are deposited at different process temperatures and are thus formed as thin films having different film qualities. For example, the first protective film 60 and the second protective film 70 may have different film density, different roughness, different film colors, etc., and these film qualities may be examined through a transmission electron microscope TEM.

For example, the second protective film 70 may have higher film density than the first protective film 60. For example, when the first protective film 60 and the second protective film 70 are formed of an aluminum oxide, the first protective film 60 may have a film density of greater than or equal to about 2.5, and the second protective film 70 may have a film density of greater than or equal to about 2.8. However, the film density may be changed depending on process conditions and is not limited thereto.

For example, the second protective film 70 may include fewer impurities than the first protective film 60.

In this way, the first protective film 60 is formed as a heat-resistance layer on the organic device 10 and thus may prevent or inhibit degradation of the organic device 10 and simultaneously have relatively high film qualities or properties without restriction of a temperature in the subsequent process. As a result, the first protective film 60 may effectively block or decrease inflow of moisture and oxygen from the external environment.

The first protective film 60 may, for example, have a thickness of about 1 nm to about 50 nm.

The second protective film 70 may be thicker than the first protective film 60, and may have a thickness, for example, of about 20 nm to about 1 μm.

The third protective film 80 may be formed of any material capable of sealing the organic device 10, for example, an inorganic material, an organic material, organic/inorganic composite, or a combination thereof. The third protective film 80 may include, for example, an oxide, nitride, or oxynitride, an organic material, or an organic/inorganic composite, for example, an oxide, nitride, or oxynitride including at least one of aluminum, titanium, zirconium, hafnium, tantalum, and silicon. The third protective film 80 may include a different material from those of the first protective film 60 and the second protective film 70.

The third protective film 80 also relates to relatively little or no degradation of the organic material in the organic layer 40, like the second protective film 70, and thus may be formed at a relatively high temperature and have relatively high film qualities or properties.

The third protective film 80 may have a thickness ranging from about 50 nm to about 500 nm.

On the third protective film 80, an additional sealing material (not shown) may be formed. The additional sealing material may be, for example, glass, but is not limited thereto.

Hereinafter, a method of manufacturing the organic electronic device according to example embodiments is illustrated referring to FIG. 1.

First of all, the first electrode 20 is formed on a substrate (not shown). The first electrode 20 may be, for example, formed of a metal (e.g., aluminum and silver), or a conductive oxide (e.g., ITO and IZO). The first electrode 20 may be, for example, formed through sputtering etc., but is not limited thereto.

Subsequently, an organic layer 40 is formed on the first electrode 20. The organic layer 40 may be formed of at least one organic material in a dry process (e.g., chemical vapor deposition (CVD)) or a solution process (e.g., spin coating, slit coating, bar coating, and Inkjet printing).

Subsequently, a second electrode 30 is formed on the organic layer 40. The second electrode 30 may be, for example, formed of a metal (e.g., aluminum and silver), or a conductive oxide (e.g., ITO and IZO). The first electrode 20 may be, for example, formed through sputtering etc., but is not limited thereto.

Subsequently, the first protective film 60, the second protective film 70, and the third protective film 80 are sequentially formed on the second electrode 30.

The first protective film 60 and the second protective film 70 may be deposited with the same material at different process temperatures.

The first protective film 60 may be, for example, formed by depositing an oxide, nitride, or oxynitride, for example, an oxide, nitride, or oxynitride including at least one of aluminum (Al), titanium (Ti), zirconium (Zr), hafnium (Hf), tantalum (Ta), and silicon (Si).

The first protective film 60 may be deposited at a temperature at which an organic material included in the organic layer 40 of the organic device 10 is not degraded, for example, a lower temperature than at a glass transition temperature ($T_g$) or a thermal deposition temperature ($T_d$) of the organic material.

The first protective film 60 may be, for example, deposited at less than or equal to about 110° C., for example, at a temperature ranging from about 50 to 110° C. The first protective film 60 may be, for example, formed in an atomic layer deposition method within the temperature range, but is not limited thereto.

The second protective film 70 may be formed by depositing the same material as the first protective film 60.

The second protective film 70 may be deposited at a higher temperature than the first protective film 60, for example, at less than or equal to about 220° C. The second protective film 70 may be deposited at a temperature ranging from about 80 to about 220° C. within the range, and for example, at a temperature ranging from about 100 to about 200° C. The second protective film 70 may be, for example, formed in an atomic layer deposition method, a chemical vapor deposition (CVD) method, etc., but is not limited thereto.

In this way, the degradation of the organic device 10 possibly occurring in the subsequent process may be prevented or inhibited by forming the first protective film 60 before the second protective film 70. In addition, the second protective film 70 is deposited at a relatively high temperature without restriction of a process temperature, and thus may be formed as a thin film having a desired condition. As a result, the second protective film 70 may effectively block or decrease inflow of moisture and oxygen from the external environment.

Subsequently, an additional sealing material may be formed on the third protective film 80. The additional sealing material may be, for example, glass, but is not limited thereto.

The organic electronic device including the organic material is not particularly limited, and may be, for example, an organic light emitting device, an organic photoelectric device, an organic solar cell, an organic photo-sensor, a photo-detector, etc. . . .

The organic electronic device may be applied to various electronic devices. The electronic device may be a display device, a sensor, a camera, a mobile phone, or an electricity generating apparatus, but is not limited thereto. For example, when the organic electronic device is an organic light emitting device, the organic light emitting device may be applied to an organic light emitting device (OLED) display. Also, when the organic electronic device is an organic photoelectric device, the organic photoelectric device may be applied to an organic image sensor. Finally, when the organic electronic device is an organic solar cell, the organic solar cell may be applied to an organic solar cell assembly.

Hereinafter, as an example of an electronic device, an organic image sensor is described.

Figure 2:
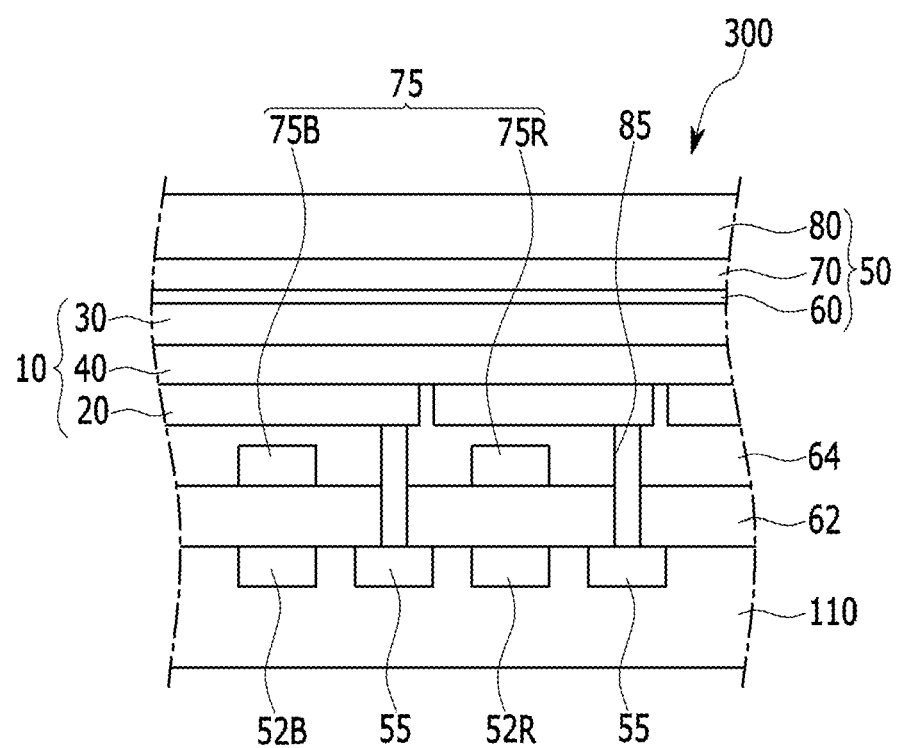
FIG. 2 is a schematic cross-sectional view showing an organic image sensor according to example embodiments.

FIG. 2 is a schematic cross-sectional view of an organic image sensor according to example embodiments.

Referring to FIG. 2, an organic image sensor 300 according to example embodiments includes a semiconductor substrate 110 integrated with photo-sensing devices 52B and 52R, a transmission transistor (not shown), and charge storage devices 55, a lower insulation layer 62, a color filter layer 75, an upper insulation layer 64, an organic device 10, and an encapsulation structure 50.

The semiconductor substrate 110 may be a silicon substrate, and is integrated with the photo-sensing devices 52B and 52R, the transmission transistor (not shown), and the charge storage device 55. The photo-sensing devices 52R and 52B may be photodiodes.

The photo-sensing devices 52B and 52R, the transmission transistor, and/or the charge storage device 55 may be integrated in each pixel, and as shown in the drawing, the photo-sensing devices 52B and 52R may be included in a blue pixel and a red pixel and the charge storage device 55 may be included in a green pixel.

The photo-sensing devices 52B and 52R sense light, the information sensed by the photo-sensing devices may be transferred by the transmission transistor, the charge storage device 55 is electrically connected with the organic device 10, and the information of the charge storage device 55 may be transferred by the transmission transistor.

In drawings, the photo-sensing devices 52B and 52R are, for example, arranged in parallel without limitation, and the blue photo-sensing device 52B and the red photo-sensing device 52R may be stacked in a vertical direction.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but are not limited thereto. Further, an example embodiment of the organic image sensor is not limited to the aforementioned structure, for example, the metal wire and pad may be positioned under the photo-sensing devices 52B and 52R.

The lower insulation layer 62 is formed on the metal wire and the pad. The lower insulation layer 62 may be made of an inorganic insulating material (e.g., a silicon oxide and/or a silicon nitride), or a low dielectric constant (low K) material (e.g., SiC, SiCOH, SiCO, and SiOF). The lower insulation layer 62 has a trench exposing the charge storage device 55. The trench may be filled with fillers.

The color filter layer 75 is formed on the lower insulation layer 62. The color filter layer 75 includes a blue filter 75B formed in the blue pixel and a red filter 75R filled in the red pixel. In some example embodiments, a green filter is not included, but a green filter may be further included.

The color filter layer 75 may be omitted. For example, when the blue photo-sensing device 52B and the red photo-sensing device 52R are stacked in a vertical direction, the blue photo-sensing device 52B and the red photo-sensing device 52R may selectively absorb light in each wavelength region depending on their stack depth, and the color filter layer 75 may not be included.

The upper insulation layer 64 is formed on the color filter layer 75. The upper insulation layer 64 may eliminate a step caused by the color filter layer 75 and smoothes the surface. The upper insulation layer 64 and the lower insulation layer 62 may include a contact hole (not shown) exposing a pad, and a through-hole 85 exposing the charge storage device 55 of the green pixel.

The organic device 10 is formed on the upper insulation layer 64. The organic device 10 may be an organic photoelectric conversion layer.

The organic device 10 includes a first electrode 20, an organic layer 40, and a second electrode 30 as described above.

One of the first electrode 20 and the second electrode 30 is an anode and the other is a cathode. At least one of the first electrode 20 and the second electrode 30 may be a light-transmitting electrode, and the light-transmitting electrode may be made of, for example, a transparent conductor (e.g., indium tin oxide (ITO) or indium zinc oxide (IZO)), or a metal thin layer of a thin monolayer or multilayer. When one of the first electrode 20 and the second electrode 30 is a non-light-transmitting electrode, the non-light-transmitting electrode may be made of, for example, an opaque conductor (e.g., aluminum (Al)).

For example, the first electrode 20 and the second electrode 30 may be light-transmitting electrodes.

The organic layer 40 includes a p-type semiconductor and an n-type semiconductor to form a pn junction, and absorbs external light to generate excitons and then separates the generated excitons into holes and electrons.

The organic layer 40 includes a p-type semiconductor and an n-type semiconductor, and at least one of the p-type semiconductor and the n-type semiconductor includes an organic material that selectively absorbs light in a green wavelength region. The organic material may have, for example, a maximum absorption wavelength ($\lambda_{max}$) of about 500 nm to about 600 nm and an energy bandgap of about 2.0 to about 2.5 eV.

The organic layer 40 may be a single layer or a multilayer. The organic layer 40 may be, for example, an intrinsic layer (I layer), a p-type layer/I layer, an I layer/n-type layer, a p-type layer/I layer/n-type layer, a p-type layer/n-type layer, etc. . . .

The intrinsic layer (I layer) may include the p-type semiconductor and the n-type semiconductor in a ratio of about 1:100 to about 100:1. The p-type semiconductor and the n-type semiconductor may be included in a ratio ranging from about 1:50 to about 50:1 within the range, specifically, about 1:10 to about 10:1, and more specifically, about 1:about 1. When the p-type and n-type semiconductors have a composition ratio within the range, an exciton may be effectively produced and a pn junction may be effectively formed.

The p-type layer may include the p-type semiconductor compound, and the n-type layer may include the n-type semiconductor compound.

The organic layer 40 may have a thickness of about 1 nm to about 500 nm, and for example, about 5 nm to about 300 nm. When organic layer 40 has a thickness within the range, the active layer may effectively absorb light, effectively separate holes from electrons, and transport them, thereby effectively improving photoelectric conversion efficiency. The organic layer 40 may have a thickness absorbing light of greater than or equal to about 70%, for example, greater than or equal to about 80%, and for example, greater than or equal to about 90% considering an absorption coefficient.

In the organic device 10, when light enters from the first electrode 20 and/or second electrode 30, and when the organic layer 40 absorbs light having a predetermined or given wavelength region, excitons may be produced. The excitons are separated into holes and electrons in the organic layer 40, and the separated holes are transported to an anode that is one of the first electrode 20 and second electrode 30 and the separated electrons are transported to the cathode that is the other of the first electrode 20 and second electrode 30 so as to flow a current in the organic device 10.

An auxiliary layer (not shown) may be further present between the first electrode 20 and the organic layer 40 and/or between the second electrode 30 and the organic layer 40. The auxiliary layer may facilitate the transfer of holes and electrons separated from the organic layer 40, so as to increase efficiency. The auxiliary layer may include, for example, an organic material, an inorganic material, or an organic/inorganic material. The organic material may be an organic compound having hole or electron characteristics, and the inorganic material may be, for example, metal oxides (e.g., molybdenum oxide, tungsten oxide, and nickel oxide).

The encapsulation structure 50 including the first protective film 60, the second protective film 70, and the third protective film 80 is formed on an organic device 10. The encapsulation structure 50 including the first protective film 60, the second protective film 70, and the third protective film 80 is the same as described above.

The organic image sensor may be applied, for example, to a mobile phone, a digital camera, etc., but is not limited thereto.

Hereinafter, the present disclosure is illustrated in more detail with reference to examples. However, these examples are exemplary, and the present disclosure is not limited thereto.

Manufacture of Organic Electronic Device

Example 1

A lower electrode is formed by sputtering ITO on a glass substrate and patterning it, and an organic photoelectric conversion layer is formed thereon by co-depositing 2-((5-(naphthalen-1-yl(phenyl)amino)selenophen-2-yl)methylene)-1H -cyclopenta[b]naphthalene-1,3(2H)-dione as a p-type semiconductor and C60 as a n-type semiconductor. Subsequently, an upper electrode is formed by depositing molybdenum oxide on the organic photoelectric conversion layer and sputtering ITO thereon. Subsequently, a protective film is formed by using aluminum oxide in an atomic layer deposition method on the upper electrode at 100° C. and covering it to seal it with a glass plate, manufacturing an organic electronic device.

Example 2

An organic electronic device is manufactured according to the same method as Example 1, except for using 2-((5-(naphthalen-1-yl(phenyl)amino)selenophen-2-yl)methylene)-1H-indene-1,3(2H)-dione instead of 2-((5-(naphthalen-1-yl(phenyl)amino)selenophen-2-yl)methylene)-1H -cyclopenta[b]naphthalene-1,3(2H)-dione as a p-type semiconductor for the organic photoelectric conversion layer.

Example 3

A lower electrode is formed by sputtering ITO on a glass substrate and patterning it, and an organic photoelectric conversion layer is formed thereon by codepositing 2-((5-(naphthalen-1-yl(phenyl)amino)selenophen-2-yl)methylene)-1H -indene-1,3(2H)-dione as a p-type semiconductor and C60 as an n-type semiconductor. Subsequently, an upper electrode is formed by depositing molybdenum oxide on the organic photoelectric conversion layer and sputtering ITO thereon. Subsequently, a lower protective film is formed on the upper electrode by using aluminum oxide in an atomic layer deposition method at 100° C., and a middle protective film is formed by depositing the aluminum oxide again at 160° C. Subsequently, an upper protective film is formed by depositing silicon oxynitride (SiON) at 100° C. on the middle protective film and covering it with a glass plate to seal it, manufacturing an organic electronic device.

Example 4

A lower electrode is formed by sputtering ITO on a glass substrate and patterning it, and an organic photoelectric conversion layer is formed by codepositing 2-((5-(naphthalen-1-yl(phenyl)amino)selenophen-2-yl)methylene)-1H-indene-1,3(2H)-dione as a p-type semiconductor and C60 as an n-type semiconductor. Subsequently, an upper electrode is formed by depositing molybdenum oxide on the organic photoelectric conversion layer and sputtering ITO thereon. Subsequently, a lower protective film is formed by using aluminum oxide on the upper electrode in an atomic layer deposition method at 100° C., and a middle protective film is formed thereon by depositing the aluminum oxide again at 160° C. Subsequently, an upper protective film is formed by depositing silicon oxynitride (SiON) on the middle protective film at 160° C. and covering it with a glass plate to seal it, manufacturing an organic electronic device.

Comparative Example 1

An organic electronic device is manufactured according to the same method as Example 1 except for forming no protective film.

Comparative Example 2

An organic electronic device is manufactured according to the same method as Example 2 except for forming no protective film.

Comparative Example 3

An organic electronic device is manufactured according to the same method as Example 1 except for forming a protective film by depositing aluminum oxide at 140° C.

Evaluation

Evaluation 1

The organic electronic devices according to Examples 1 and 2 and Comparative Examples 1 and 2 are annealed and evaluated regarding their degradation degree.

The evaluation is performed by examining external quantum efficiency change (ΔEQE) of the organic electronic devices according to Examples 1 and 2 and Comparative Examples 1 and 2 while their temperatures are increased from room temperature (25° C.) to 160 to 180° C.

Figure 3:
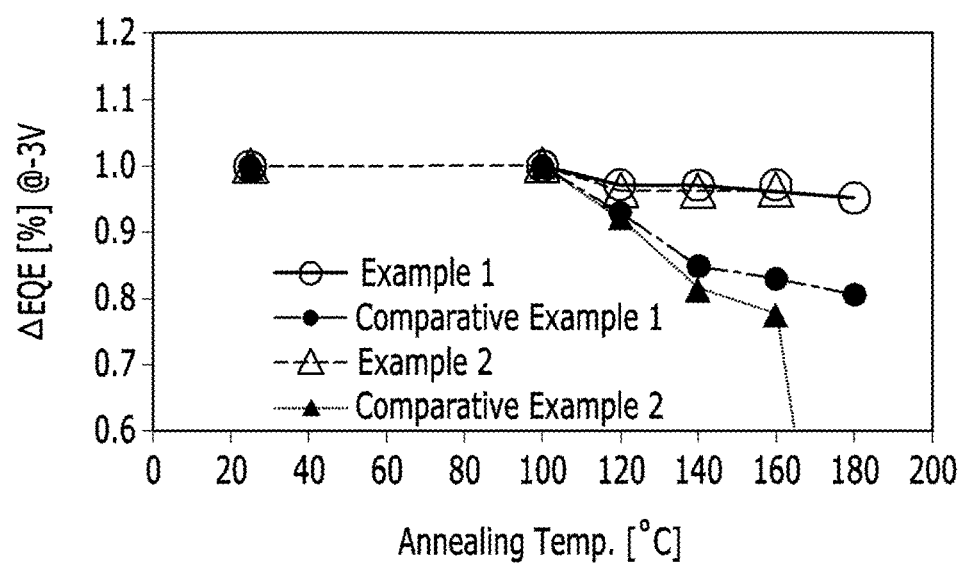
FIG. 3 is a graph showing external quantum efficiency change of organic electronic devices according to Examples 1 and 2 and Comparative Examples 1 and 2 depending on an annealing temperature.

FIG. 3 is a graph showing the efficiency changes of the organic electronic devices according to Examples 1 and 2 and Comparative Examples 1 and 2 depending on an annealing temperature.

Referring to FIG. 3, the organic electronic device according to Example 1 shows a relatively small external quantum efficiency change depending on a temperature compared with the organic electronic device according to Comparative Example 1, and the organic electronic device according to Example 2 shows a relatively small external quantum efficiency change depending on a temperature compared with the organic electronic device according to Comparative Example 2.

Specifically, the organic electronic devices according to Examples 1 and 2 show almost no external quantum efficiency change at a temperature ranging from about 160 to 180° C., while the organic electronic devices according to Comparative Examples 1 and 2 show deteriorated external quantum efficiency at greater than or equal to about 120° C. Accordingly, the organic electronic devices according to Examples 1 and 2 may be prevented or inhibited from degradation of the organic photoelectric conversion layer by the protective film.

Evaluation 2

Electrical and optical properties of the organic electronic devices according to Example 1 and Comparative Example 3 are evaluated.

The evaluation is performed by measuring current density of the organic electronic devices according to Example 1 and Comparative Example 3 and external quantum efficiency thereof depending on a wavelength.

Figure 4:
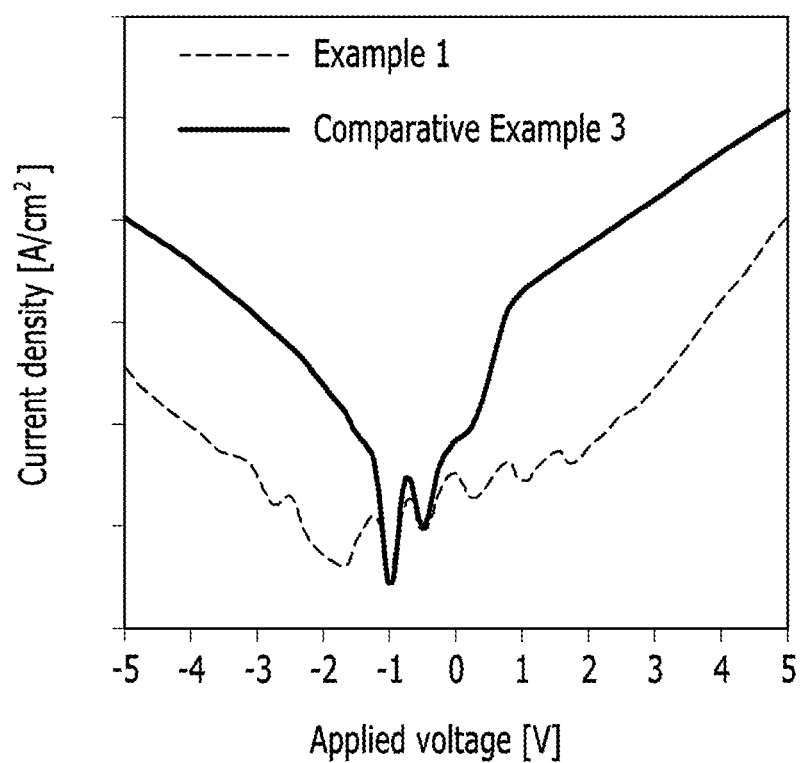
FIG. 4 is a graph showing current density of organic electronic devices according to Example 1 and Comparative Example 3.
Figure 5:
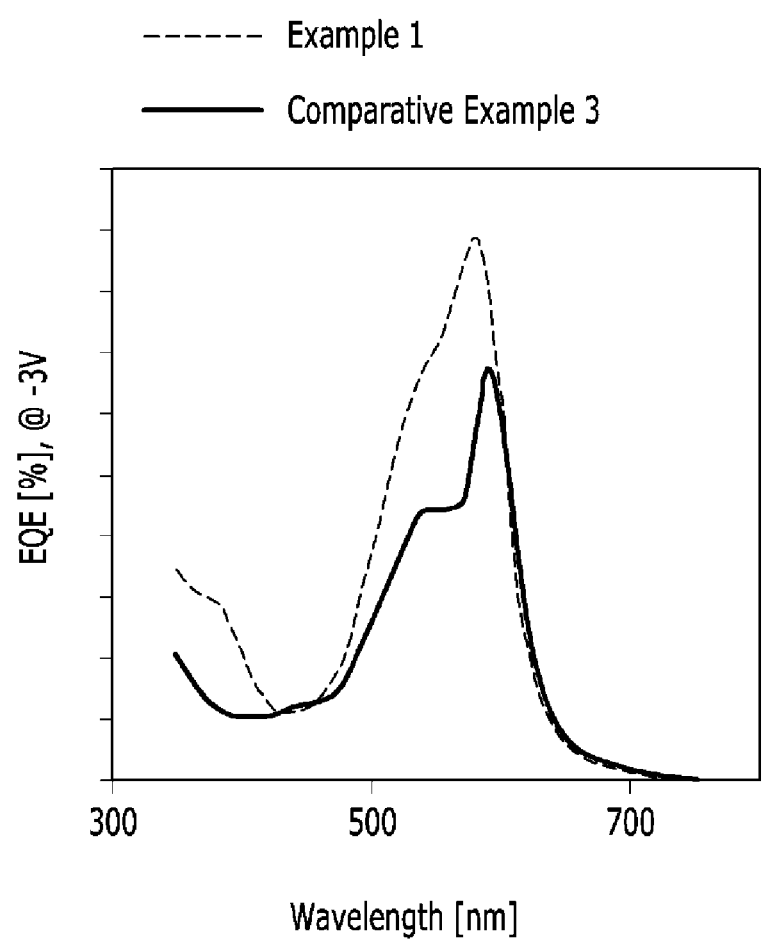
FIG. 5 is a graph showing external quantum efficiency of the organic electronic devices according to Example 1 and Comparative Example 3 depending on a wavelength.

FIG. 4 is a graph showing the current density of the organic electronic devices according to Example 1 and Comparative Example 3, and FIG. 5 is a graph showing the external quantum efficiency of the organic electronic devices according to Example 1 and Comparative Example 3 depending on a wavelength.

Referring to FIG. 4, the organic electronic device according to Example 1 shows satisfactory current density compared with the organic electronic device according to Comparative Example 3.

Referring to FIG. 5, the organic electronic device according to Example 1 shows relatively high external quantum efficiency in a wavelength region ranging from about 500 to 600 nm, that is, in a green wavelength region, compared with the organic electronic device according to Comparative Example 3.

Accordingly, the organic electronic device including a protective film formed at a relatively low temperature according to Example 1 may be prevented or inhibited from degradation of an organic photoelectric conversion layer compared with the organic electronic device including a protective film formed at a relatively high temperature according to Comparative Example 3.

Evaluation 3

Electrical and optical property changes of the organic electronic devices according to Examples 3 and 4 are evaluated by holding them at a high temperature for a relatively long time in a highly humid environment.

The evaluation is performed by examining the electrical and optical property changes while the organic electronic devices according to Examples 3 and 4 are stored at 85° C. under humidity of 85% in a predetermined or given tester for about 1200 hours.

Figure 6:
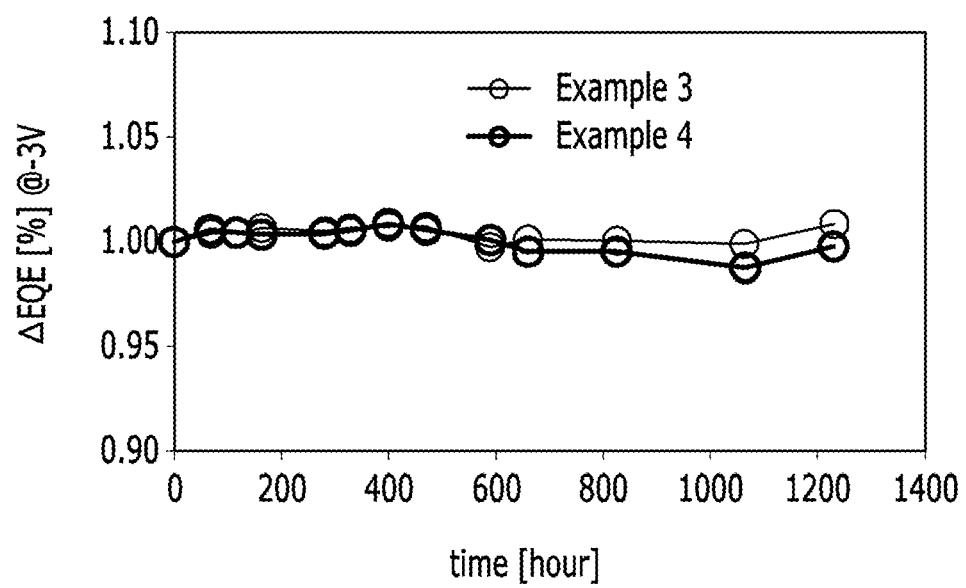
FIG. 6 is a graph showing external quantum efficiency change of organic photoelectric devices according to Examples 3 and 4 depending on time.
Figure 7:
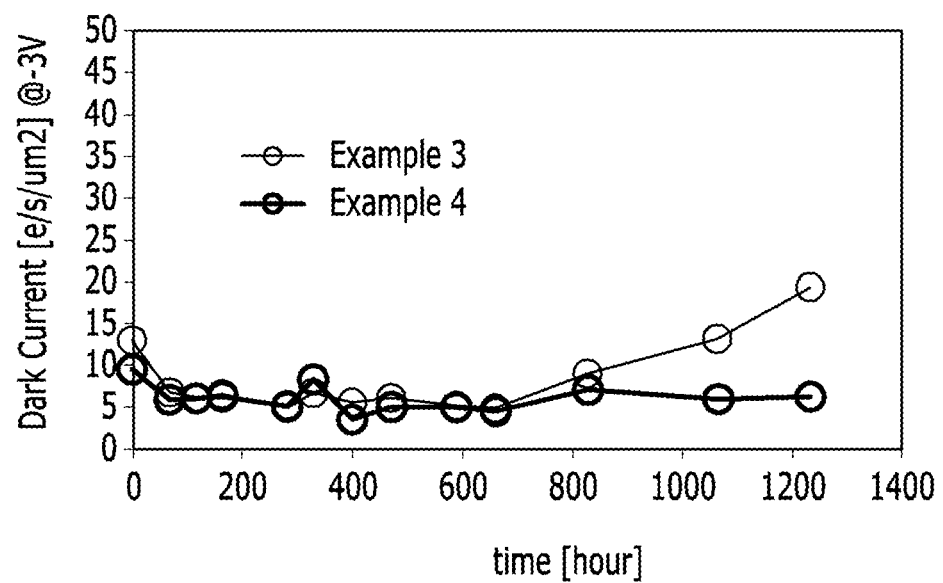
FIG. 7 is a graph showing leakage current changes of the organic electronic devices according to Examples 3 and 4.

FIG. 6 is a graph showing external quantum efficiency changes of the organic photoelectric devices according to Examples 3 and 4 depending on time, and FIG. 7 is a graph showing leakage current changes of the organic electronic devices according to Examples 3 and 4 depending on time.

Referring to FIG. 6, the organic electronic devices according to Examples 3 and 4 show almost no external quantum efficiency changed until 1200 hours.

Referring to FIG. 7, the organic electronic devices according to Examples 3 and 4 show no large leakage current change until about 1200 hours.

In addition, referring to FIGS. 6 and 7, the organic electronic device including a middle protective film and an upper protective film formed at 160° C. according to Example 4 shows relatively small degradation.

Accordingly, the organic electronic devices according to Examples 3 and 4 are protected from degradation of electrical and optical properties in the subsequent process even when exposed to a relatively high temperature, because an organic photoelectric conversion layer is protected by a lower protective film. Accordingly, because a protective film is formed at a relatively high temperature, an encapsulation structure having relatively satisfactory performance may be formed.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A method of manufacturing an organic electronic device, comprising:
    manufacturing an organic device including an organic material;
    forming a first protective film on the organic device at a first temperature, the first protective film including a first material;
    forming a second protective film on the first protective film at a second temperature higher than the first temperature, the second protective film including the first material; and
    forming a third protective film on the second protective film, the third protective film including a second material different from the first material,
    wherein the second material includes an oxide, nitride, or oxynitride that is different from the first material.

2. The method of claim 1, wherein the forming a first protective film forms the first protective film at the first temperature of less than or equal to about 110° C.

3. The method of claim 1, wherein the forming a second protective film forms the second protective film at the second temperature of less than or equal to about 220° C.

4. The method of claim 1, wherein the forming a first protective film forms the first protective film by an atomic layer deposition method.

5. The method of claim 1, wherein the manufacturing an organic device comprises:
    forming a first electrode;
    forming at least one organic layer on the first electrode; and
    forming a second electrode on the organic layer.

6. The method of claim 1, wherein
    the first material is an oxide, nitride, or oxynitride including at least one of aluminum (Al), titanium (Ti), zirconium (Zr), hafnium (Hf), tantalum (Ta), or silicon (Si),
    the second material is an oxide, nitride, or oxynitride including at least one of aluminum (Al), titanium (Ti), zirconium (Zr), hafnium (Hf), tantalum (Ta), or silicon (Si), and
    the second material being different from the first material.

7. The method of claim 1, wherein the first material is an oxide, nitride, or oxynitride including at least one of aluminum (Al), titanium (Ti), zirconium (Zr), hafnium (Hf), or tantalum (Ta), and
    the second material is an oxide, nitride, or oxynitride including silicon (Si).

* * * * *